(12) United States Patent
Adams et al.

(10) Patent No.: US 6,181,155 B1
(45) Date of Patent: Jan. 30, 2001

(54) METHOD AND APPARATUS FOR TESTING DYNAMIC LOGIC USING AN IMPROVED RESET PULSE

(75) Inventors: R. Dean Adams, Vestal, NY (US); Patrick R. Hansen, Essex Junction, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/301,040

(22) Filed: Apr. 28, 1999

(51) Int. Cl.[7] .................................................. H03K 19/00
(52) U.S. Cl. ................................ 326/16; 326/93; 326/112
(58) Field of Search .................................. 326/16, 93, 98, 326/95, 112, 119, 121

(56) References Cited

U.S. PATENT DOCUMENTS

| | | |
|---|---|---|
| 4,656,417 | 4/1987 | Kirkpatrick et al. . |
| 5,495,188 | 2/1996 | Chen et al. . |
| 5,617,047 | 4/1997 | Henkels et al. . |
| 5,748,012 | 5/1998 | Beakes et al. . |
| 5,828,234 * | 10/1998 | Sprauge ................................ 326/98 |
| 6,064,245 * | 5/2000 | Singh et al. . |
| 6,075,386 * | 6/2000 | Naffziger ............................. 326/98 |

\* cited by examiner

*Primary Examiner*—Michael Tokar
*Assistant Examiner*—Don Phu Le
(74) *Attorney, Agent, or Firm*—Richard A. Henkler

(57) ABSTRACT

A method and apparatus for detecting whether dynamic logic circuits are precharging properly. The method and apparatus uses a narrowed reset pulse to verify precharging is occurring as designed.

8 Claims, 2 Drawing Sheets

METHOD AND APPARATUS FOR TESTING DYNAMIC LOGIC USING AN IMPROVED RESET PULSE

BACKGROUND

TECHNICAL FIELD OF THE PRESENT INVENTION

The present invention generally relates to dynamic circuits and more specifically, to methods and apparatus that use the reset pulse to test whether such dynamic logic circuits are operating properly.

BACKGROUND OF THE PRESENT INVENTION

High speed electronic devices such as digital data processors rely on stored data signals for control of instruction signals. High speed devices, thus, require high speed access to stored digital signals. For example in both processing and memory circuits the requirement for high speed operation has lead to increasing densities of integration in electronic circuit design, and circuits which, once triggered, can carry out relatively complex functions autonomously. For example register files and other memory structures represent such devices.

Timing constraints are of critical concern in high performance data processing and memory circuits, as cycle times are reduced for higher speed. Signals require a finite amount of time to propagate through any type of electrical or electronic structure, and the proper function of logic circuits require that the intended signals be present at the inputs in order to obtain the correct output.

Signal propagation time is affected by many factors of circuit design, such as conductor resistance and parasitic capacitances. At high densities of circuit integration, the number of circuits to which a connection is made may present severe design constraints in regard to cycle time. For example, at high integration densities, a connection such as a word or bit line of a memory will present significant RC delays and waveform distortions where the total switched capacitance, (C) is dominated by the sum of device capacitances of a large number of load devices, and the total resistance, (R) is dominated lay the resistance of the long word or bit lines of a small cross-section.

To obtain highest operational speed, and shortest cycle time in logic circuits employing, currently available MOS technology, it is common practice to employ socalled "dynamic" logic circuits in preference to static logic circuits. In general, dynamic circuits have the goal of maximizing the speed at which a logical function (e.g. "evaluation") is achieved by minimizing the number of switching devices in the evaluation path, and by employing NMOS, rather than the slower-switching PMOS, for the majority of devices in the evaluation path. This optimization of speed of the evaluation path, or "forward path", is achieved at the cost of subsequently having to "reset", or "pre-charge", dynamic nodes, in preparation for the next logic cycle, to a state from which they may be switched to the other logic state most rapidly, and then only when necessary in accordance with input signals which are evaluated.

In general, the total time period for which a reset, or pre-charge, operation can occur, is ultimately derived from a global (master) clock which is distributed throughout the entire chip. Overall, the reset time period is a small portion of the global cycle, and is pre-defined to the circuit designers. The circuit designers typically design the dynamic circuits to reset within the allocated reset pulse width period in order to avoid degrading the critical evaluation time (i.e. faster reset times require larger reset devices which degrade actual time to performance).

Various faults in a dynamic circuit can result in a degraded pre-charging. The faulty circuit does, in fact, pre-charge, but only in a slower than expected fashion. To ensure a defect-free chip these faults must be detected. Current fault testing methods use the entire allocated reset period for testing. The current testing is based upon the assumption that any existing faults within the dyanmic circuit which are marginal (i.e. they require most if not all of the entire reset period to prechage) will not further degrade over time. This assumption is incorrect.

It would, therefore be a distinct advantage to have a method and apparatus that would adequately test for slower than expected pre-charging of a dynamic circuit. The present invention provides such a method and apparatus.

SUMMARY OF THE PRESENT INVENTION

The present invention is a method and apparatus for detecting whether dynamic logic circuits are pre-charing properly. Specifically, a narrowed rreset pulse is used to verify pre-charging, is occurring as designed.

DETAILED DESCRIPTION OF THE PREFERRED EMBODIMENT OF THE PRESENT INVENTION

In the following description, numerous specific details are set forth such as specific word or bit lengths, etc., to provide a thorough understanding of the present intention. However, it will be obvious to those of ordinary skill in the art that the present invention can be practiced, with different details. In other instances, well-know circuits have been shown in block diagram form in order not to obscure the present invention unnecessary detail. For the most part, details concerning timing, considerations and the like have been omitted inasmuch as such details are not necessary to obtain a complete understanding of the present invention, and are within the skills of persons of ordinary skill in the relevant art given the description proiveded below.

Figure 1:
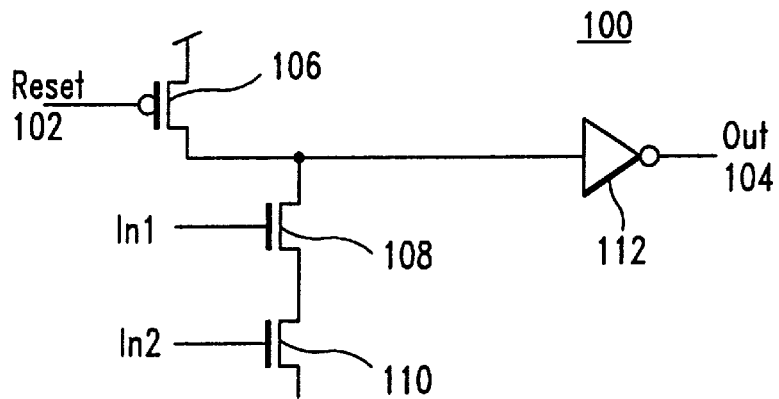
FIG. 1 is a schematic diagram illustrating a simple dynamic AND gate.

Reference now being made to FIG. 1, a schematic diagram of a simple dynamic AND gate 100 is illustrated. The AND gate 100 includes a reset MOSFET 106, two input MOSFETs 108 and 110, respectively, and an inverter 112 for providing the desired output signal 104. Specific details concerning how such a dynamic AND gate function are well known and understood by those of ordinary skill in the relevant art, and therefore, further discussion thereof is deemed unnecessary. In order to provide a better understanding of the problems associated with faulty pre-charging, a timing diagram of the evaluation and reset portions for AND gate 100 are described in connection with FIG. 2.

Figure 2:
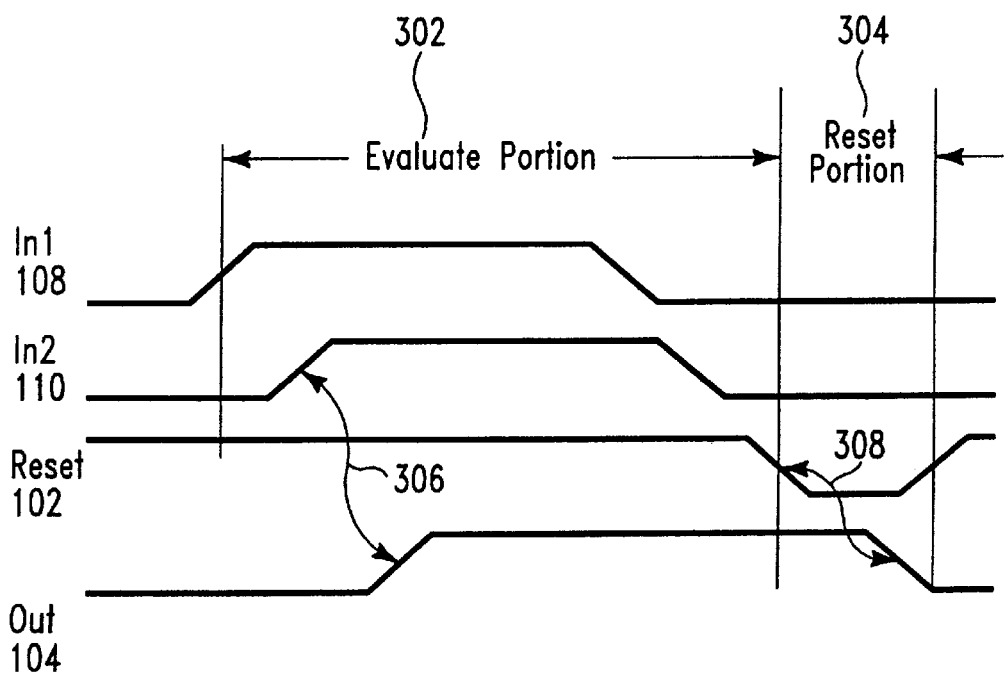
FIG. 2 is a timing diagram illustrating various waveforms for the AND gate of FIG. 1.

Reference now being made to FIG. 2, a timing diagram is shown illustrating various wave forms for to MOSFETs 106, 108, 104, and inverter 110. More specifically, FIG. 2 illustrates the evaluation timing portion 302 and reset portion 304 for the inputs IN 1 106 and IN 2 108 for MOSFETs 106 and 108, respectively, and for the output signal 104. It should also be noted, as indicated by designation 306, once broth IN 1 106 and IN 2 108 have been driven high the desired output occurs after some predesignated delay 306. Furthermore, once reset signal 102 has been driven low another delay 308 occurs during pre-charge of AND gate 100.

Various faults can result in a degraded precharging of the dynamic circuit. More specifically, although the faulty circuit does precharge, it does so only in a slower than expected fashion. Current methods of testing assume that if a dynamic circuit operates properly within the entire allocated reset pulse period, then the circuit is error free (i.e. the performance or accuracy of the dynamic circuit will not degrade over time). This assumption is incorrect. The present invention detects faulty precharging of dynamic circuits that would be unnoticed by this prior incorrect assumption as explained in greater detail in connection with the descriptions of FIGS. 3 and 4.

Figure 3:
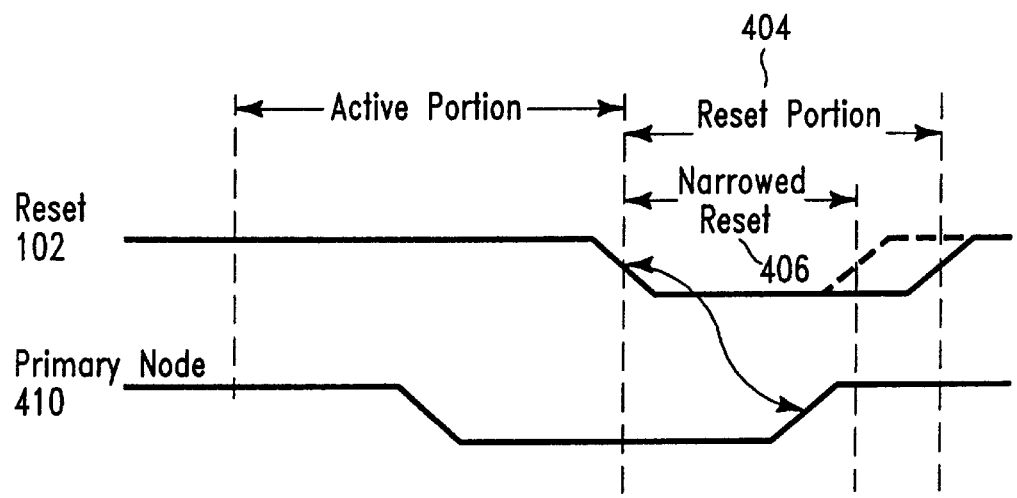
FIG. 3 is a timing diagram illustrating the restriction of the duration of the reset signal for dynamic circuits according to a preferred embodiment of the present invention.

Reference now being made to FIG. 3, a timing diagram is shown illustrating restricting the duration of the reset signal 102 according to a preferred embodiment of the present invention. The present invention tests the pre-charging of a dynamic circuit by stressing the limits of resetting. Specifically, the present invention reduces the amount of time that the dynamic circuit has to reset in a test mode. As shown in FIG. 3, the reset signal 102 (pulse) has an available period "Reset Portion" 404 as originally allocated by the clock designer. The duration of the reset signal is circuit specific. Consequently, the exact width of the reset signal can be different for each desired circuit. Thus, there can be numerous methods for determining the exact width. One such method is to use a particular error-free circuit design, which will be duplicated, and narrowing the reset signal for this circuit until errors start occurring. Thereafter, the width of the reset signal is slightly increased until such errors no longer occur. After the above noted process has been completed, the narrowed reset signal used on all similar circuits and any such similar circuits having errors are considered to be candidates for pre-charging problems.

The primary node 410 is shown as being reset high. With a narrowed reset pulse width as illustrated by designation 406, a pre-charging fault can be detected since a dynamic circuit which is not pre-charged fails to evaluate correctly (logically). The narrowed reset signal 406 as demonstrated by the present invention can be generated in numerous ways. For example one method would be to use an on-chip clock generator as illustrated by FIG. 4.

Figure 4:
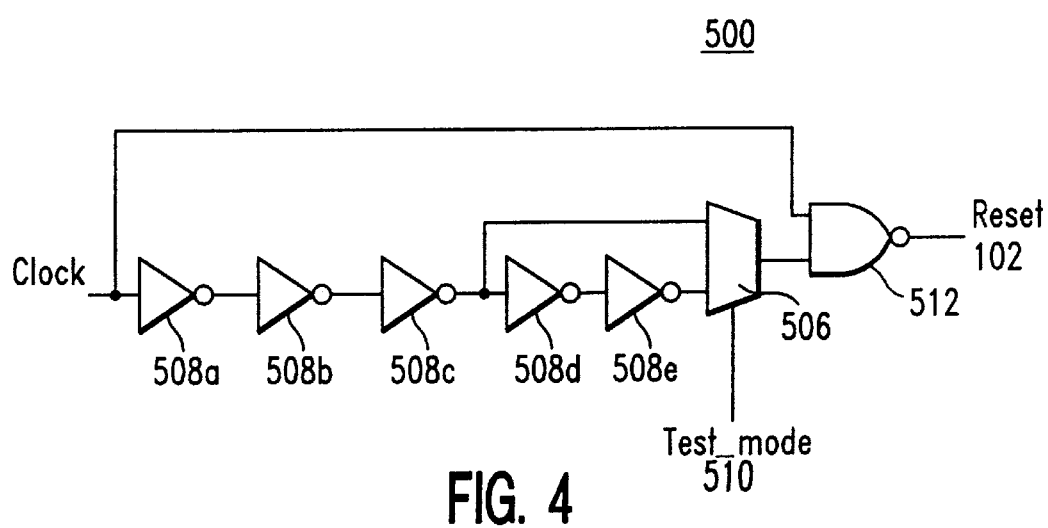
FIG. 4 is a schematic diagram illustrating an on-chip clock generator for generating the narrowed-restricted reset signal of FIG. 3 according to the teachings of the preferred embodiment of the present invention.

Reference now being made to FIG. 4, a schematic diagram is shown illustrating an on-chip clock generator 500 for generating a narrowed/restricted reset signal 102 in accordance with the teachings of the preferred embodiment of the present invention. The on-chip generator 500 includes 5 inverters 508A–E, a multiplexer 506 and a NAND gate 512 for generating the reset narrowed/restricted signal 102.

The inclusion of the multiplexer 506 and the Test-Mode input 510 provides the ability to select either a normal or narrowed reset signal 102. It should be noted, however, that numerous variations can be achieved on the reset pulse by using a larger multi-way multiplexer with more taps along the inverter strain. This type of on-chip clock generator is useful in characterizing the exact point of failure for even a good circuit.

It is thus believed that the operation and construction of the present invention will be apparent from the foregoing description. While the method and system shown and described has been characterized as being preferred it will be readily apparent that various changes and/or modifications could be made wherein without departing from the spirit and scope of the present invention as defined in the following claims.

What is claimed is:

1. A method of testing a dynamic logic circuit for defects, the method comprising the steps of:

defining a reset pulse from a master clock for precharging a dynamic logic circuit;

narrowing the defined reset pulse;

detecting, in response to receiving the narrowed reset pulse, a defective output from the dynamic logic circuit.

2. The method of claim 1 further comprising the step of:

propagating the narrowed reset pulse to the dynamic logic circuit.

3. The method of claim 2 wherein the step of narrowing includes the steps of:

decreasing the defined reset pulse;

detecting, in response to receiving the decreased reset pulse, an output indicating that a non-defective circuit failed to precharge properly; and increasing the reset pulse period until the outputs of the non-defective circuit indicate proper precharging is occurring, the reset pulse period being smaller than the defined reset pulse period.

4. A method of testing a dynamic logic circuit for defects, the method comprising the steps of:

defining a reset pulse from a master clock for precharging a dynamic logic circuit, decreasing the defined reset pulse;

detecting, in response to receiving the decreased reset pulse an output indicating that a non-defective circuit failed to precharge properly; and increasing the reset pulse period until the outputs of the non-defective circuit indicate proper precharging is occurring, the reset pulse period being smaller than the defined reset pulse period detecting, in response to receiving the increased reset pulse, a defective output from the dynamic logic circuit.

5. The method of claim 4 further comprising the step of:

propagating the increased reset pulse to the dynamic logic circuit.

6. An apparatus for testing a dynamic logic circuit for defects, the apparatus comprising:

means for defining a reset pulse from a master clock for precharging a dynamic logic circuit;

means for narrowing the defined reset pulse;

means for detecting, in response to receiving the narrowed reset pulse, a defective output from the dynamic logic circuit.

7. The apparatus of claim 6 further comprising:

means for propagating the narrowed reset pulse to the dynamic logic circuit.

8. The apparatus of claim 7 wherein the means for narrowing includes:

means for decreasing the defined reset pulse;

means for detecting, in response to receiving the decreased reset pulse, an output indication that a non-defective circuit failed to precharge properly; and means for increasing the reset pulse period until the outputs of the non-defective circuit indicate proper precharging is occurring, the reset pulse period being smaller than the defined reset pulse period.

* * * * *